United States Patent [19]

Lee et al.

[11] Patent Number: 5,416,860
[45] Date of Patent: May 16, 1995

[54] METHOD AND APPARATUS FOR OPTICALLY MEASURING ELECTRIC CURRENT AND/OR MAGNETIC FIELD WITH TEMPERATURE COMPENSATION

[75] Inventors: Yen-Zen Lee, Chu-Pei; K. Roger Lee, Tainan, both of Taiwan, Prov. of China

[73] Assignee: Industrial Technology Research Institute, Taiwan, Prov. of China

[21] Appl. No.: 296,600

[22] Filed: Aug. 29, 1994

[51] Int. Cl.$^6$ ............................................. G01R 15/07
[52] U.S. Cl. ......................................... 385/12; 324/96;
 250/227.17; 250/227.21; 356/345; 356/351;
 385/11
[58] Field of Search ........................... 385/12, 6, 4, 11;
 250/227.14, 227.17, 227.19, 227.21, 227.11;
 356/345, 351; 324/96, 105, 244.1

[56] References Cited

U.S. PATENT DOCUMENTS

| | | | |
|---|---|---|---|
| 4,675,522 | 6/1987 | Arunkumar | 250/227.19 |
| 4,929,050 | 5/1990 | Wilson | 385/12 |
| 4,988,212 | 1/1991 | Sun et al. | 250/227.11 |
| 5,021,647 | 6/1991 | Tatsuno et al. | 250/227.21 |

*Primary Examiner*—Rodney B. Bovernick
*Assistant Examiner*—Hemang Sanghavi
*Attorney, Agent, or Firm*—Michael D. Bednarek; Marks & Murase

[57] ABSTRACT

A system for measuring the strength of fiber optical current in an AC magnetic field by adopting Faraday effect and temperature compensation. In general, the current measurement systems that adopt Faraday effect have the structure including a Faraday element, a polarizer and an analyzer. When a light beam is directed through the Faraday element, the plane of polarization rotates according to the strength of induced magnetic field and Verdet constant in the Faraday element. The rotation affects the optical intensity sensed by the analyzer. The variation on light intensity after passing through the analyzer is converted into an electric current by a optical-electric transducer. But the accuracy of this system this system always affected by the ambient environment, wherein the major factor is the thermal effect of Verdet constant. This invention utilizes thermo-optical sensing device to sense the temperature variation in Faraday element, and furthermore utilizes the sensed variation as means of compensation to regulate the process of current measurement so that will not be affected by ambient temperature.

8 Claims, 8 Drawing Sheets

METHOD AND APPARATUS FOR OPTICALLY MEASURING ELECTRIC CURRENT AND/OR MAGNETIC FIELD WITH TEMPERATURE COMPENSATION

BACKGROUND OF THE INVENTION

The present invention relates generally to a method and an apparatus for optically measuring or determining an amount of electric current/strength of a magnetic field by using Faraday effect. More particularly, the invention is concerned with a method and an apparatus for optically measuring an electric current/magnetic field strength with temperature compensation.

Using Faraday effect, i.e., an magneto-optical effect, to measure the strength of a magnetic field attracts more and more attention of the industrial world. This technique uses a light beam as a mean for the measurement because it is immune to the electromagnetic induction noise. This feature is used for the application of measuring electric current which generates a magnetic field.

Such a magneto-optical technique utilizing the Faraday effect is usually realized by an apparatus having a Faraday element or magneto-optical element, a polarizer and an analyzer, a light source device for generating a light beam, and an opto-electric transducer for converting an optical output from magneto-optical element into an electric signal. The magneto-optical element modulates the incident light beam according to the strength of a magnetic field to which the magneto-optical element is exposed. The modulated light beam is received by the opto-electric transducer.

In the apparatus indicated above, the light beam produced by the light source device is linearly polarized by the polarizer, and the linearly polarized light beam is transmitted through the Faraday element or magneto-optical element in the magnetic field. As a result, the plane of polarization of the linearly light beam is rotated as a function of the strength of magnetic field, due to the Faraday effect. Then the rotated light beam is incident upon the analyzer having a polarizing direction different from that of the polarizer, whereby the angle of rotation is converted into the amount of light which has passed through the analyzer. In other words, a change in the optical output of the Faraday element corresponds to a change in the strength of the magnetic field. As is well known in the art, the optical output of the Faraday element is expressed by a formula which includes the Verdet's constant. According to this formula, the strength of the magnetic field and the amount of electric current which induces the magnetic field, may be determined.

However, the method mentioned above suffers from an inherent problem that the output signal level is influenced by a change in the environments around the apparatus. For instance, the formula used to determine the magnetic field strength including the Verdet's constant of the material of magneto-optical element which has a certain degree of temperature dependence.

Figure 1:
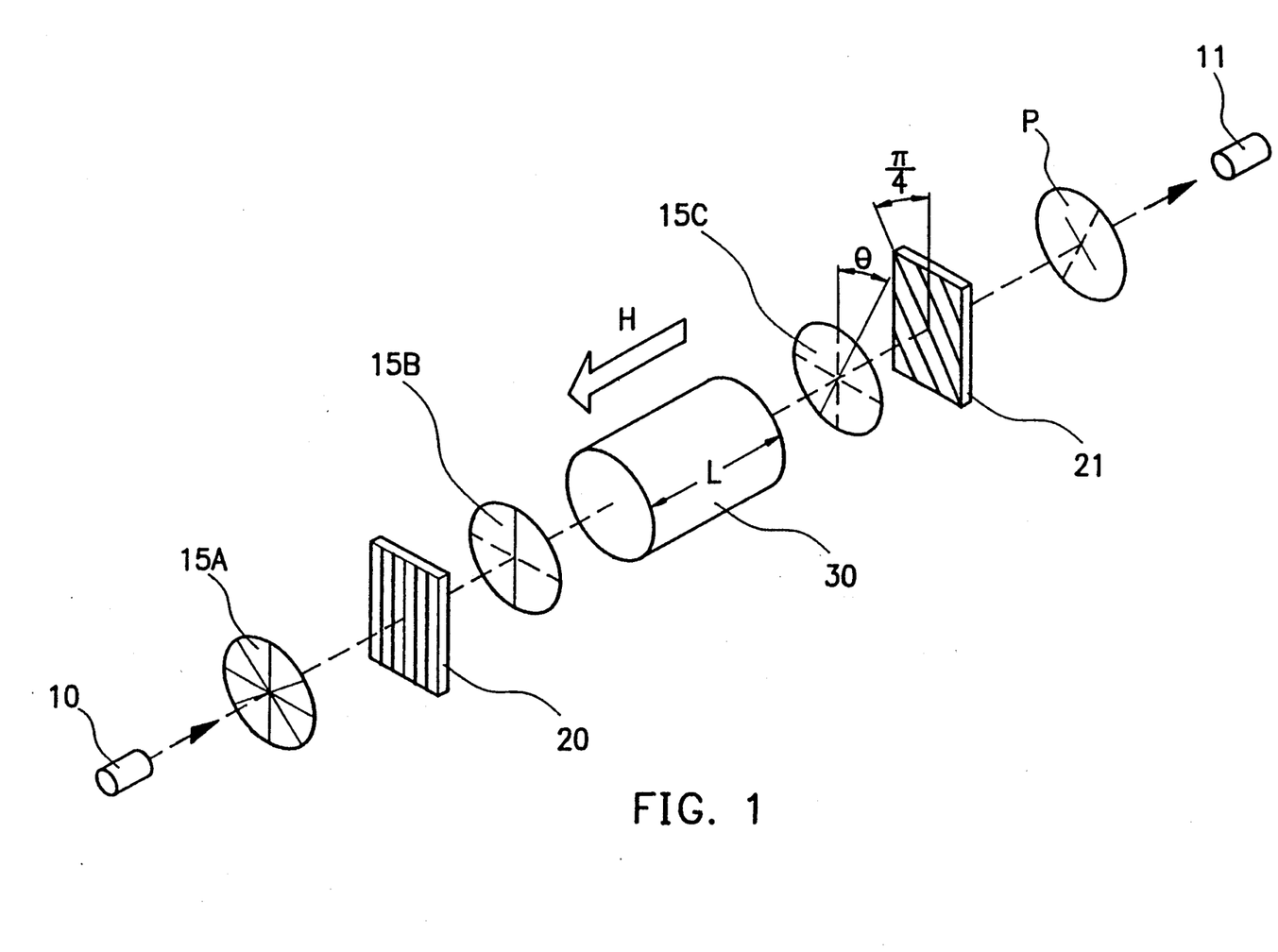
FIG. 1 is a conceptual illustration of the system in the prior art.

Refer to FIG. 1, which is the prior art method of optically measuring a magnetic field or the strength of electric current by utilizing Faraday effect, includes a light source device 10, a polarizer 20, a magneto-optical element(Faraday element) 30, an analyzer 21, and an optical-electric transducer 11. These elements are arranged along an optical path of the light source device. The light source device 10 emits a light beam 15A to polarizer 20. The light beam coming out of the polarizer 20 becomes linearly polarized beam 15B and then passes through a magneto-optical element 30 with length L. Under the effect of a magnetic field H, the linearly polarized light beam 15B when passing through the magneto-optical element 30 is thereby rotated to an angle $\Theta$ on its plane of polarization. The polarizedly rotated beam 15C is directed through an analyzer 21 which outputs the optical signal P with modulated intensity corresponding to the rotation angle. The optical signal P is then converted by an optical-electric transducer 11 into an electric signal, which stands for the measurement of magneto-optical element. The relationship of angle e and the biased optical signal P may be represented by the following formulas:

$$\Theta = Ve*H*L \quad (1)$$

$$P = Po(1 + \sin(2\Theta)) = Po(1 + \sin(2*Ve*H*L)) \quad (2)$$

where
Ve = Verdet's constant
H = strength of magnetic field
L = length of Faraday element Also, the angle between the polarizer and the analyzer is 45°.

From equation (1) and equation (2), it is obvious that the rotation angle $\Theta$ varies with Verdet's constant, and the optical signal P is also related to Verdet's constant. Because of this Verdet's constant, the prior art is also temperature dependent. In other words, the measurement of the prior art will be influenced by the operating environments. However, this drawback may be compensated by employing the concept of temperature compensation as the one introduced in this invention so that the result of measurement is independent of operating environments.

SUMMARY OF THE INVENTION

It is therefore an object of this invention to provide a method and an apparatus for optically measuring an electric current/magnetic field strength with temperature compensation to prevent from being influenced by the operating environments.

This invention provides a measuring apparatus which includes a magneto-optical element, a polarizer, an analyzer, a light source device for producing a light beam to which the magneto-optical element is exposed, an optical-electric transducer for converting an optical signal output from magneto-optical element into an electric signal, and a thermo-optical sensing device which characterizes in: when placed near the magneto-optical element, it can sense the temperature variation of the magneto-optical element influenced by the ambient environment.

The method for optically measuring an electric current/magnetic field strength with temperature compensation comprises the steps of: (a) placing the magneto-optical element in an electric current induced magnetic field which thereby biases the light beam while the light beam is transmitted through the magneto-optical element; (b) directing a light beam generated by a light source device into the polarizer which polarizes the incident light beam into a linearly polarized light beam; (c) directing the linearly polarized light beam which propagates through the magneto-optical element and is thereby rotated on the polarization plane by the effect of magnetic field, into the analyzer which modulates the amount of light through it and thus regulates the intensity of the light beam, depending on the rotation angle on the polarization plane: (d) directing the output of the analyzer into the optical-electric transducer which converts the optical signal output from the analyzer into an electric current (AC+DC) whose amplitude level corresponds to the intensity of the optical signal input from the analyzer; (e) directing another light beam generated by the light source device into thermo-optical sensing device which senses the temperature variation by thermally modulating the intensity of the light beam propagating therethrough; (f) directing the optical signal with its intensity modulated by the thermo-optical sensing device into the optical-electric transducer which converts the optical signal output from the thermo-optical sensing device into an electric current (DC) whose amplitude level corresponds to the intensity of the incident optical signal; (g) utilizing a simple signal processing technique to incorporate the DC value from the thermo-optical sensing device as a temperature compensation factor into the system so as to obtain an true measurement without being influenced by the operating environments.

In the method of this invention as described above, the linearly polarized light beam is modulated by the magneto-optical element or Faraday-effect element according to the strength of magnetic field. The thus obtained optical output of the magneto-optical element is further converted into a corresponding electric signal which determines the measurement of detected magnetic field as well as the amount of electric current which gives this magnetic field. Meanwhile another light beam emitted from the light source device is directed to a thermo-optical sensing device which thereby thermally biases the intensity of the incident light beam and later output the light beam with modulated intensity to an optical-electric transducer which yields a DC current value depending on the intensity as a temperature compensation that is fed back to the system to compensate the variation due to operating environments. However, the light beam can also be polarized to be a linearly polarized light beam before directing to the thermo-optical sensing device.

BRIEF DESCRIPTION OF THE DRAWINGS

The present invention can be more fully understood by reference to the following detailed description and accompanying drawings, which form the integral part of this application, and wherein.

DETAILED DESCRIPTION OF PREFERRED EMBODIMENT

Figure 2:
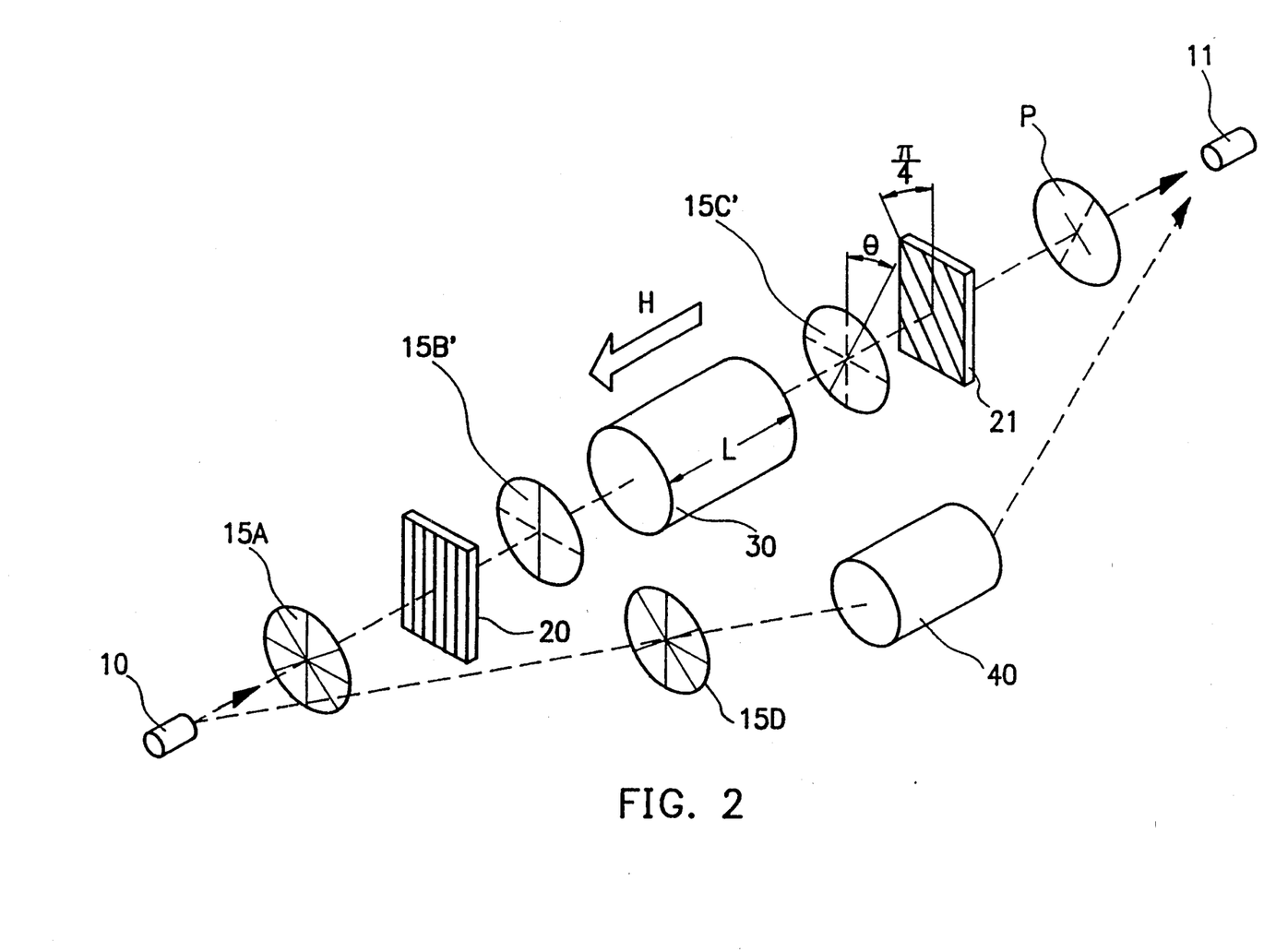
FIG. 2 is a conceptual illustration of the system in this invention.

Referring to FIG. 2, this invention is based on the prior art apparatus shown in FIG. 1. In addition to the prior art, in this invention, a thermo-optical sensing material 40 is placed near the path of the magneto-optical element 30 such as a Faraday rotator. The light source device 10 emits two light beams 15A and 15D. The light beam 15A is polarized to be a linearly polarized beam 15B after passing through the polarizer 20. The light beam 15B propagates through the magneto-optical element 30, and is thereby forced to rotate to an angle $\Theta$ on the plane of polarization by the magnetic field exerted on the magneto-optical element 30. The rotated light beam 15C is transmitted through an analyzer 21 which biases the intensity output of the light beam 15C according to the rotation angle $\Theta$. An optical-electric transducer 11 is employed to convert the biased intensity output P into an electric current signal which represents the quantity sensed by the magneto-optical element 30. Meanwhile, another light beam 15D is directed to the thermo-optical sensing device 40. The intensity of beam 15D is varied with the variation of temperature sensed by the thermo-optical sensing device 40. Applying the modulated intensity output of light beam 15D to the optical-electric transducer 11 which also converts the biased intensity output into an electric current signal which represents the quantity sensed by the thermo-optical sensing device 40.

Combining these two electric current quantities in a way of signal processing scheme, a decent result of measurement may be obtained without influenced by the operating environments.

The fiber optical current sensor with temperature compensation of this invention may be implemented in many different structural forms. The following examples are four of many embodiments. In these embodiments, there is always a small cylindrical lens in front of the end surface of the optical fiber.

Figure 3:
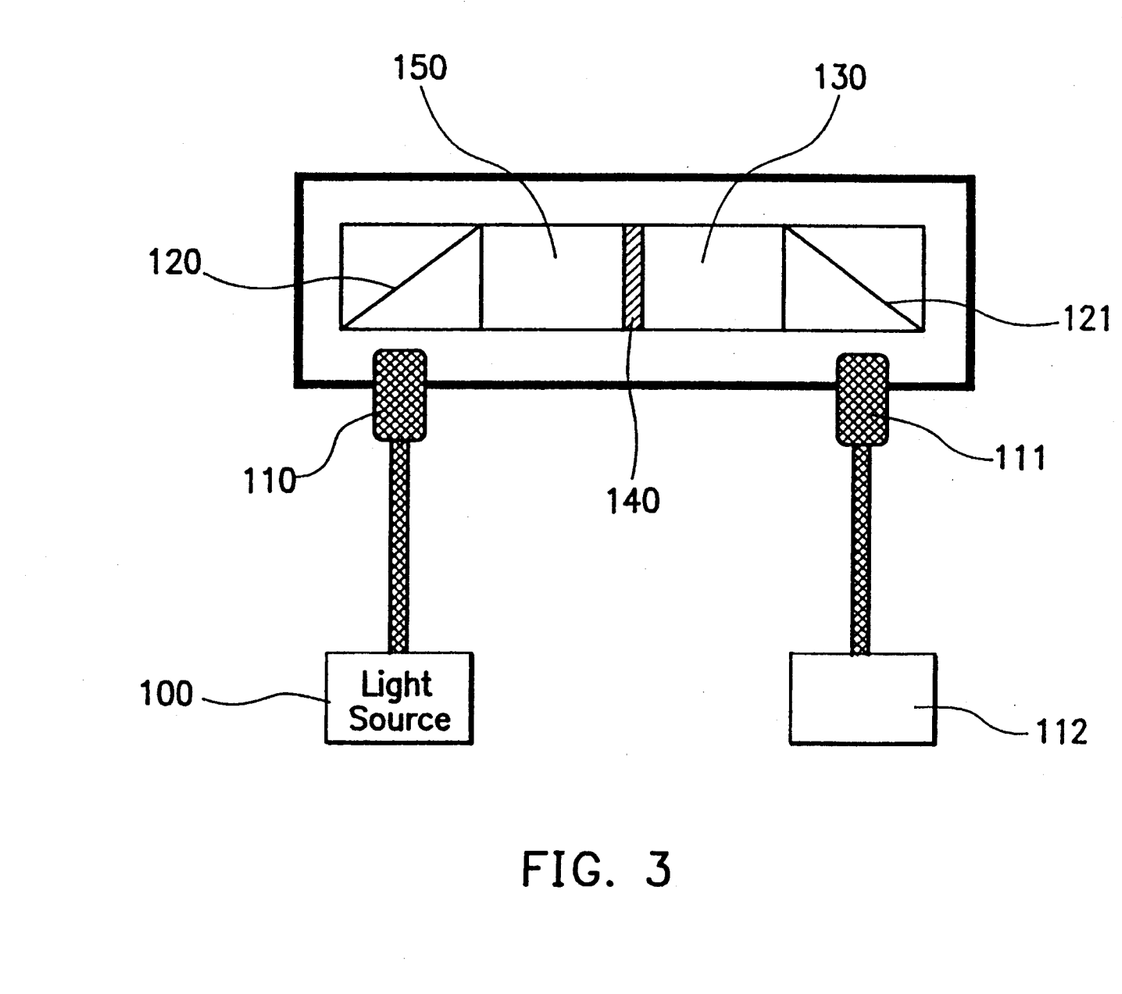
FIG. 3 is the diagram of one implementation for this invention.

Referring to FIG. 3, this structure includes two optical fibers 110 and 111, an opto-electric transducer 112, two polarizers 120 and 121, a ZnSe Faraday element 130, a thermo-optical sensing material 140, such as GaAs, and a 45° rotator 150. The light beam emitted from light source 100 via optical fiber 110 is incident upon polarizer 120. Part of the light beam is reflected to become linearly polarized beam. Then this linearly polarized beam passes through 45° rotator 150, thermo-optical sensing material 140, and Faraday element 130, and then the polarizer 121. After passing the 45° rotator 150, direction of polarization of the light beam is rotated 45°; after passing through thermo-optical sensing material 140, the intensity of light beam is biased by the thermo-optical sensing material 140 whose modulating function is affected by the change of ambient temperature; After passing through Faraday element 130, the polarizing direction of the linearly polarized light beam is further rotated to an angle because the Faraday element is exposed in a magnetic field. When part of the linearly polarized light beam is reflected by the polarizer 121, the angle of direction of polarization is converted into an intensity quantity of the optical signal, and then output to a cylindrical lens which focuses the light beam in optical fiber 111. The optical signal is then passed to an optical-electric device via optical fiber 111.

Figure 4:
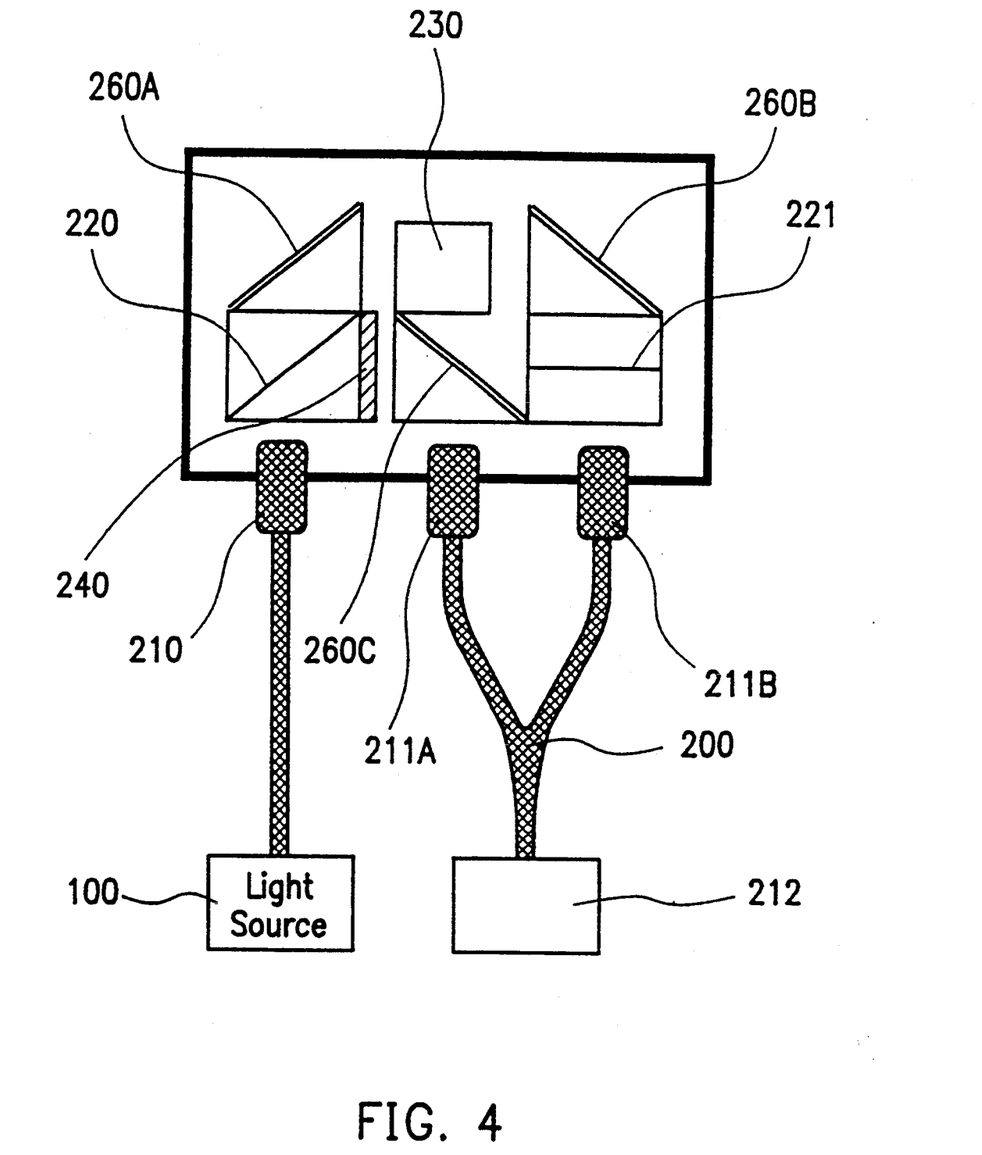
FIG. 4 is the diagram of another implementation for this invention.

Referring to FIG. 4, this structure includes a 1×2 optical fiber coupler 200; optical fibers 210, 211A, and 211B; a polarizer 220; an analyzer 221; a Faraday element 230; thermo-optical sensing material 240; and three reflection surfaces of a prism 260A, 260B, and 260C. In this structure, when the light beam emitted from light source 100 propagates via optical fibers 210 to polarizer 220, part of light is reflected while part of light transmits through. The reflected part of light beam propagating through thermo-optical sensing device 240 is reflected by reflecting surface 260C to focus in optical fiber 211A. While the transmitted part of light beam is reflected into the Faraday element 230 by the reflecting surface 260A, wherein the direction of polarization is influenced by the magnetic field and thus rotated to an angle; through the Faraday element 230, the transmitted light beam is again reflected into the analyzer 221 by reflecting surface 260B. Through the analyzer 221, the plane of polarization of the polarized light beam is rotated to an angle which is then converted into an optical signal with its intensity modulated by the analyzer. This optical signal is later focused in optical fiber 211B. Those optical signals focused into optical fibers 211A and 211B respectively are coupled via a 1×2 optical fiber coupler 200 and then propagated to an optical-electric transducer 212. In this structure, the optical fiber coupler 200 may be replaced by two optical-electric transducers to separately receive the signals from optical fibers 211A and 211B.

Figure 5:
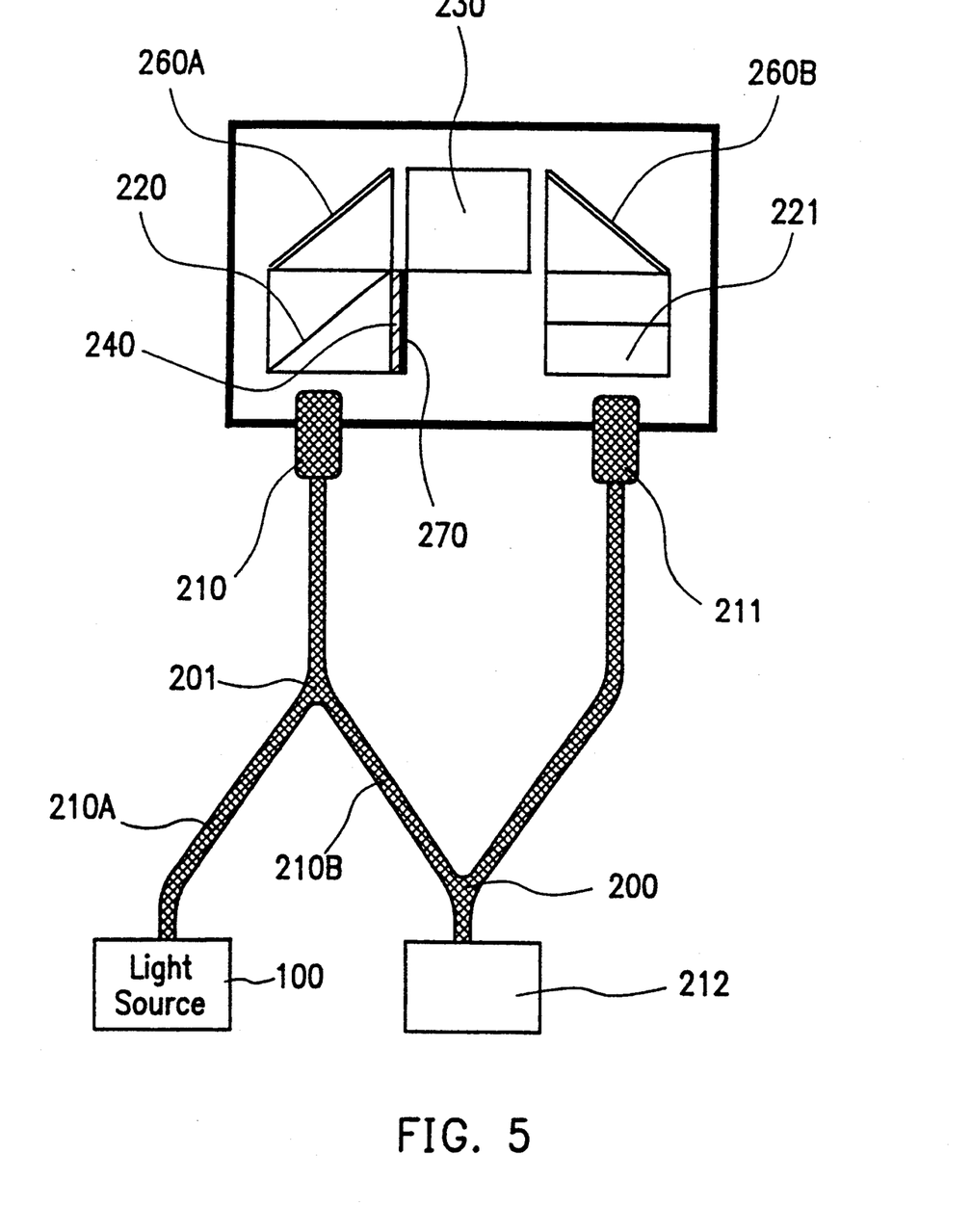
FIG. 5 is the diagram of other implementation for this invention.

Referring to FIG. 5, this structure is quite similar to the one shown in FIG. 4 except installing a total reflecting layer 270 on the other side of incident plane of thermo-optical sensing material 240 to replace the reflecting surface 260C. As the light beam emitted by the light source 100 propagates through optical fiber 210A to optical fiber 210 via a 1×2 optical fiber coupler 201 and then to polarizer 220, the linearly polarized part is reflected and transmitted through thermo-optical sensing material 240. When this happens, the linearly polarized part of light beam is reflected by the total reflecting layer 270 and follows the coming path to enter the thermo-optical sensing material 240 again, and then is focused in optical fiber 210. Again through 1×2 optical fiber coupler 201 and optical fiber 210B, the reflected light beam is directed to the optical-electric transducer 212. As for the transmitted part of light beam, the scheme is similar to the one in the structure of FIG. 4. Similarly, in this structure, the optical fiber coupler 200 may be replaced by two optical-electric transducers to separately receive the signals from optical fibers 211A and 211B.

Figure 6:
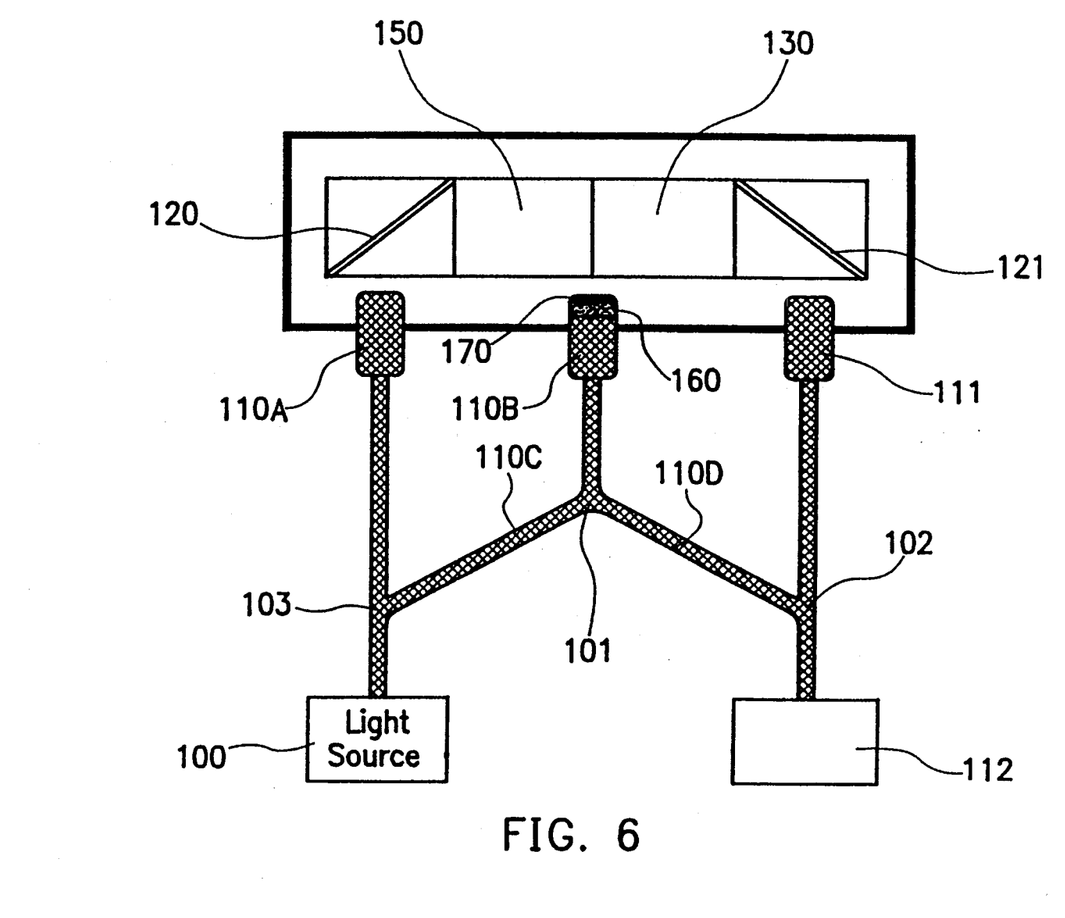
FIG. 6 is the diagram of other implementation for this invention.

FIG. 6 shows the structure similar to the one in FIG. 3 except the position of thermo-optical sensing device. In FIG. 6, the thermo-optical sensing device 160 having a total reflecting layer on the opposite side of the incident surface is placed in front of optical fiber 110B and near the Faraday element. When the light beam emitted from light source 100 passes through a 1×2 optical fiber coupler 103 which splits the incident beam into two beams, the splitted beams are propagated along optical fibers 110A and 110B respectively. The beam along optical fiber 110A reaches polarizer 120 and is polarized and reflected to a 45° rotator 150 which changes the direction of polarization to 45°. Then this rotated beam is directed into a Faraday element 130 and a polarizer 121 which biased the optical intensity of incident light beam according the rotation angle. The biased intensity of light beam is focused into optical fiber 111 by a cylindrical lens, and then propagated through a 1×2 optical fiber coupler 102 to the optical-electric transducer 112.

On the other hand, another light beam propagates along optical fiber 110C through optical fiber coupler 101 to optical fiber 110B. After passing through optical fiber 110B, this light beam is directed into the thermo-optical sensing device 160, and then reflected by the total reflection layer 170. The reflected ray once again passes through the thermo-optical sensing device 160 and is focused into optical fiber 110B. It then propagates through 1×2 optical fiber coupler 101, optical fiber 110D, another optical fiber coupler 102, and then enters the optical-electric transducer 112. In this structure, the optical fiber coupler 102 may be replaced by using two optical-electric transducers to separately receive the optical signals from optical fibers 110D and 111. Or the optical fiber coupler 103 may be replaced by using two light sources to separately provide the light beams via optical fibers 110A and 110C to the magneto-optical element and the thermo-optical sensing device, respectively.

In the embodiments described above, two optical signals obtained through their magneto-optical element and the thermo-optical sensing device are converted into two electric signals that are later used in the system which will not be influenced by the operating environments.

Figure 7:
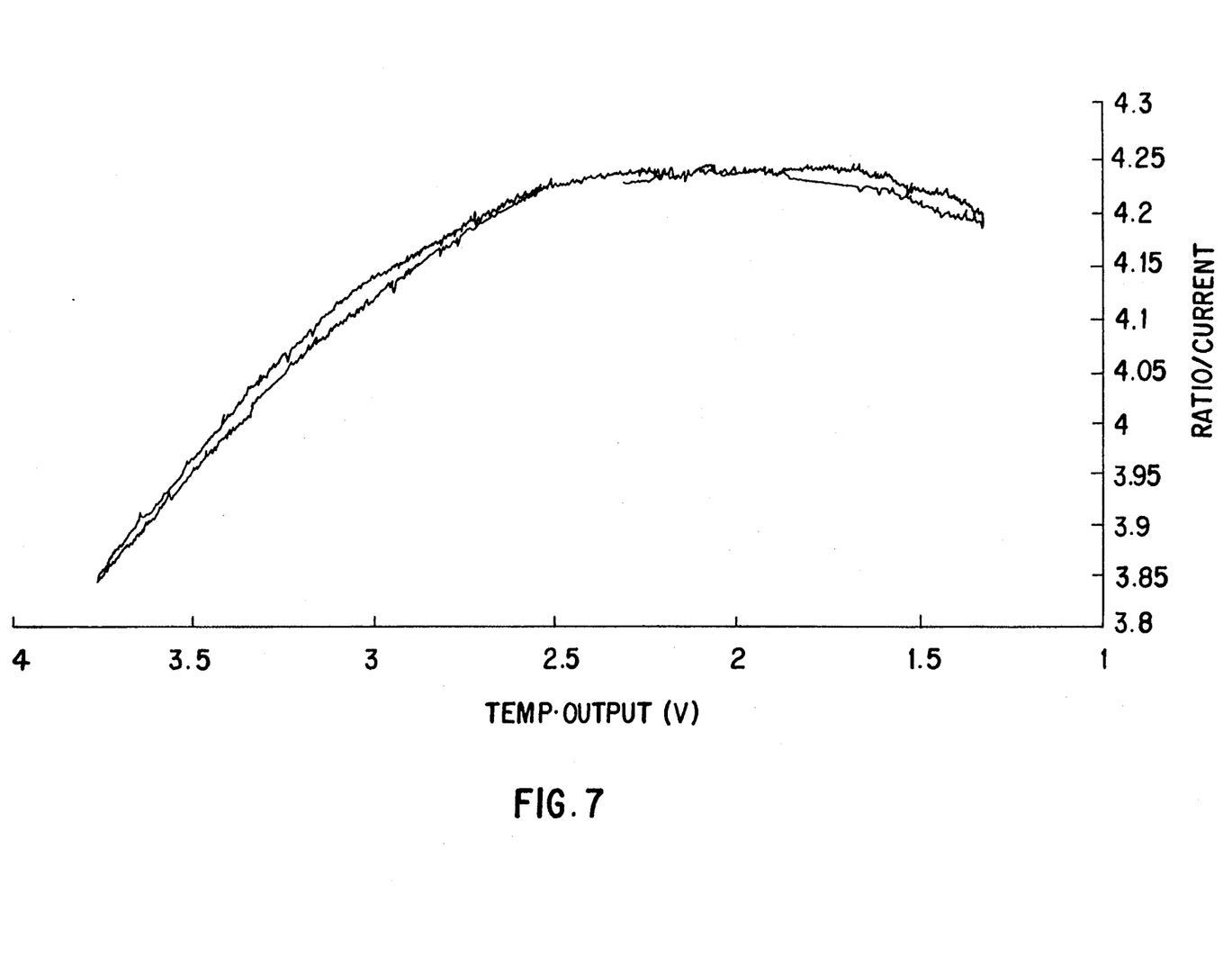
FIG. 7 is the plot of the measured Current ratio under different temperature without temperature compensation.
Figure 8:
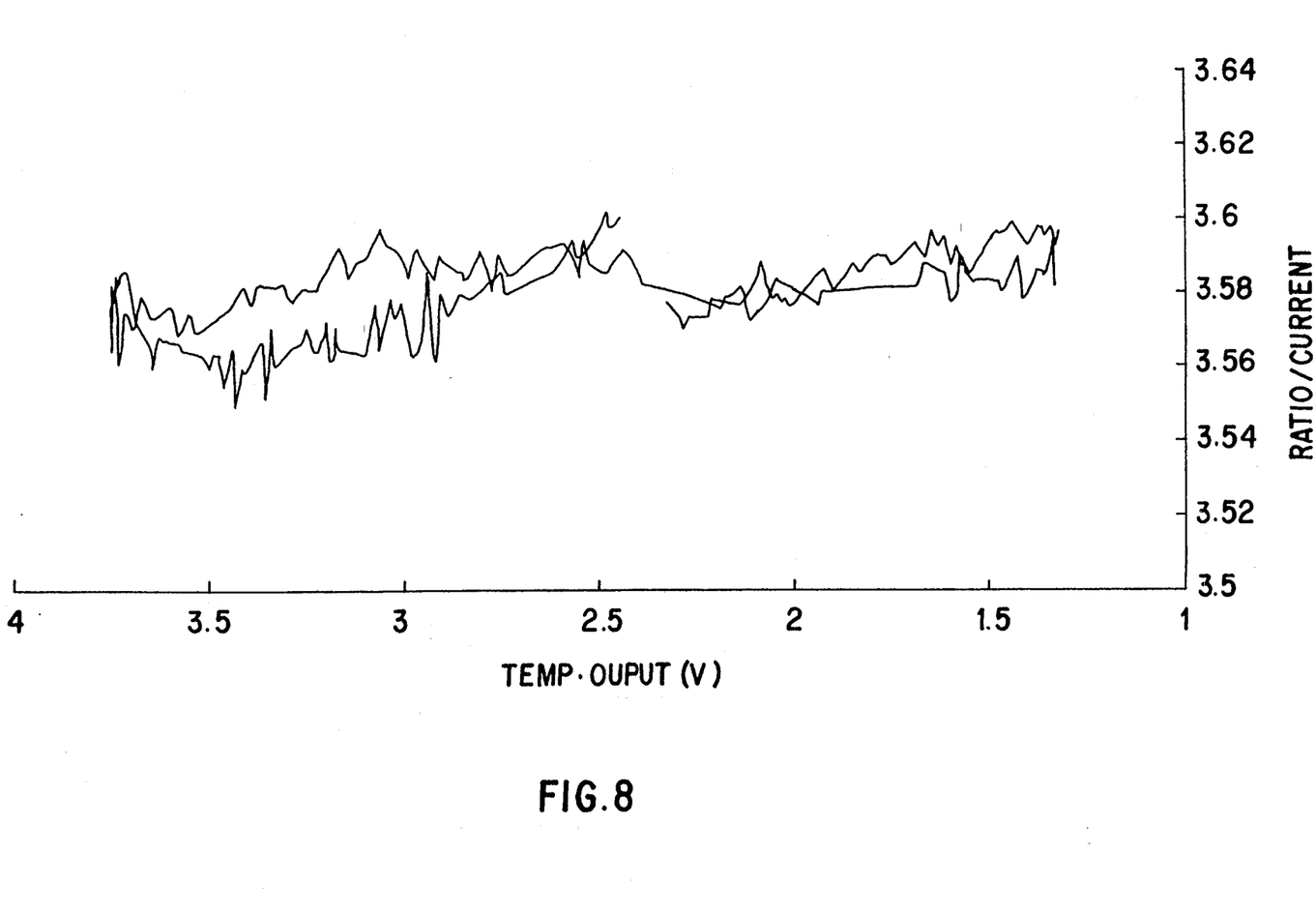
FIG. 8 is the plot of the measured Current ratio under different temperature with temperature compensation.

FIG. 7 and FIG. 8 are plots of results in testing fiber optical current sensing systems without and with temperature compensation, respectively. The temperature range of testing is from −20° C. to 70° C. Comparing these two plots, one may find that the system with temperature compensation has accuracy ten times of the system without temperature compensation.

The invention has been described above in terms of some important, preferred embodiments; however, this invention is not limited to the disclosed embodiments. On the contrary, for a person skilled in the art, it is intended to cover various modifications and similar arrangements included within the spirit and scope of the appended claims, the scope of which should be accorded the broadest possible interpretation so as to encompass all such modifications and similar structures and processes.

What is claimed is:

1. A fiber optical current sensor with temperature compensation comprising:

a light source for generating a first light beam and a second light beam;

a polarizer for polarizing the first light beam into a linearly polarized light beam;

a magneto-optical element which induces rotation on the plane of polarization of the linearly polarized light beam incident therein, according to an external magnetic field;

an analyzer for modulating the intensity of the linearly polarized light according to the rotation on the plane of polarization;

a thermo-optical sensing device for sensing the temperature variation of the magneto-optical element by thermally modulating the amount of the second light beam;

an optical-electric transducer for converting the output from the analyzer through the magneto-optical element into an AC+DC current signal which is used as an indicator of the strength of magnetic field, and converting the output from the analyzer through the thermo-optical sensing device into an DC current signal which is used as an indicator of temperature variation.

2. A method of measuring current and/or magnetic field by a fiber optical current sensor with temperature compensation comprising the steps of:
- (I) emitting a first light beam and a second light beam from a light source device, and directing the first light beam through a polarizer which polarizes the first light beam into a linearly polarized light beam;
- (II) directing the linearly polarized light beam through a magneto-optical element which causes rotation on the plane of polarization of the first linearly polarized beam;
- (III) using a analyzer to modulate the intensity of the linearly polarized light, according to the rotation on the plane of polarization;
- (IV) directing the output of the analyzer to an optical-electric transducer which converts the output of the analyzer into an AC/DC current as a magneto-optical signal according to the intensity of the output light;
- (V) directing the second light beam through a thermo-optical sensing device which senses the temperature variation of the magneto-optical element by varying the amount of the light beam propagating through the thermo-optical sensing device, which, in term, is the intensity of the light;
- (VI) directing the output of the thermo-optical sensing device to the optical-electric transducer which converts thermally sensed intensity of the light beam into a DC current value as a temperature signal;
- (VII) applying the DC current value as temperature compensation to compensate for temperature variation in the magneto-optical element.

3. A method as claimed in claim 2 wherein the light source device emits a light beam, and the light beam is splitted into two light beams by a beam splitter.

4. A method as claimed in claim 2 wherein two light devices are employed to instead of only one to produce the light beams separately through the magneto-optical element and the thermo-optical sensing device.

5. A method as claimed in claim 2 wherein two optical-electric transducers are employed to instead of only one to receive the magneto-optical signal and the temperature signal separately.

6. A method as claimed in claim 2 wherein the second light beam emitted from the light source device is propagated through the polarizer, the thermo-optical sensing device and the analyzer.

7. A method as claimed in claim 2 wherein the transmission of light beam is through optical fiber and $1\times2$ fiber optical coupler.

8. A method as claimed in claim 2 wherein on the non-incident surface of the thermo-optical sensing device, lay a total reflection coating by using evaporation method so as to reflect the incident light beam twice through the thermo-optical sensing device.

* * * * *

UNITED STATES PATENT AND TRADEMARK OFFICE
CERTIFICATE OF CORRECTION

PATENT NO. : 5,416,860
DATED : May 16, 1995
INVENTOR(S) : Yen-Zen LEE, et al.

It is certified that error appears in the above—identified patent and that said Letters Patent is hereby corrected as shown below:

On the title page, item [73] Assignee: "Prov. of china" should read --Rep. of China--.

Signed and Sealed this

First Day of August, 1995

Attest:

BRUCE LEHMAN

Attesting Officer

Commissioner of Patents and Trademarks